US012334252B2

(12) United States Patent
Tang et al.

(10) Patent No.: US 12,334,252 B2
(45) Date of Patent: Jun. 17, 2025

(54) SUBSTRATE COMPRISING AN INDUCTIVE COUPLER FOR SIGNAL LEAKAGE REDUCTION

(71) Applicant: QUALCOMM Incorporated, San Diego, CA (US)

(72) Inventors: Rui Tang, Santa Clara, CA (US); Chenqian Gan, Cambridge (CN); Zhongning Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/490,449

(22) Filed: Oct. 19, 2023

(65) Prior Publication Data

US 2024/0047131 A1 Feb. 8, 2024

Related U.S. Application Data

(62) Division of application No. 16/422,174, filed on May 24, 2019, now Pat. No. 11,823,831.

(51) Int. Cl.
*H01F 27/34* (2006.01)
*H01F 41/04* (2006.01)
(Continued)

(52) U.S. Cl.
CPC ......... *H01F 27/346* (2013.01); *H01F 41/041* (2013.01); *H05K 1/165* (2013.01); *H04B 1/525* (2013.01)

(58) Field of Classification Search
CPC ..... H01F 27/346; H01F 41/041; H05K 1/165; H04B 1/525; H04B 1/0458; H04B 1/0475; H01P 5/16
See application file for complete search history.

(56) References Cited

U.S. PATENT DOCUMENTS

2005/0237130 A1* 10/2005 Iwamoto ................ H03H 9/725
 333/133
2008/0284540 A1* 11/2008 Nishihara ............ H03H 9/0576
 333/133
(Continued)

FOREIGN PATENT DOCUMENTS

CN  105103462 A  11/2015
CN  108983166 A  12/2018
(Continued)

OTHER PUBLICATIONS

Taiwan Search Report—TW109115072—TIPO—Apr. 12, 2024.
(Continued)

*Primary Examiner* — Tuyen T Nguyen
(74) *Attorney, Agent, or Firm* — Loza & Loza

(57) ABSTRACT

A substrate that includes at least one dielectric layer and an inductive coupler formed in the at least one dielectric layer. The inductive coupler includes a first inductor and a second inductor. The first inductor is formed in the at least one dielectric layer. The first inductor is configured to be electrically coupled to a transmitter filter and an antenna. The second inductor is formed in the at least one dielectric layer. The second inductor is configured to be electrically coupled to the transmitter filter and ground. The second inductor is configured to provide a path to ground for a rejected signal having a rejected frequency. The second inductor is configured such that the rejected signal traveling through the second inductor causes the first inductor to generate an induced signal that counteracts a leakage signal traveling through the transmission filter.

15 Claims, 16 Drawing Sheets

(51) Int. Cl.
*H05K 1/16* (2006.01)
*H04B 1/525* (2015.01)

(56) References Cited

U.S. PATENT DOCUMENTS

| | | |
|---|---|---|
| 2009/0088110 A1 | 4/2009 | Schuur et al. |
| 2010/0304701 A1* | 12/2010 | Jung .................. H04B 1/525 |
| | | 455/280 |
| 2013/0114470 A1 | 5/2013 | Lee et al. |
| 2014/0011462 A1 | 1/2014 | Din et al. |
| 2014/0138792 A1 | 5/2014 | Lo et al. |
| 2017/0026019 A1 | 1/2017 | Sim et al. |
| 2017/0236638 A1 | 8/2017 | Mayo |
| 2020/0373080 A1 | 11/2020 | Tang et al. |

FOREIGN PATENT DOCUMENTS

| | | | |
|---|---|---|---|
| CN | 109155189 A | | 1/2019 |
| CN | 109743067 A | | 5/2019 |
| JP | 2004328676 A | | 11/2004 |
| JP | 2015109320 A | * | 6/2015 |
| WO | 2014081983 A1 | | 5/2014 |
| WO | 2018225590 A1 | | 12/2018 |

OTHER PUBLICATIONS

International Preliminary Report on Patentability—PCT/US2020/030500, the International Bureau of WIPO—Geneva, Switzerland, Dec. 2, 2021.
International Search Report and Written Opinion—PCT/US2020/030500—ISA/EPO—Mar. 25, 2021.

* cited by examiner

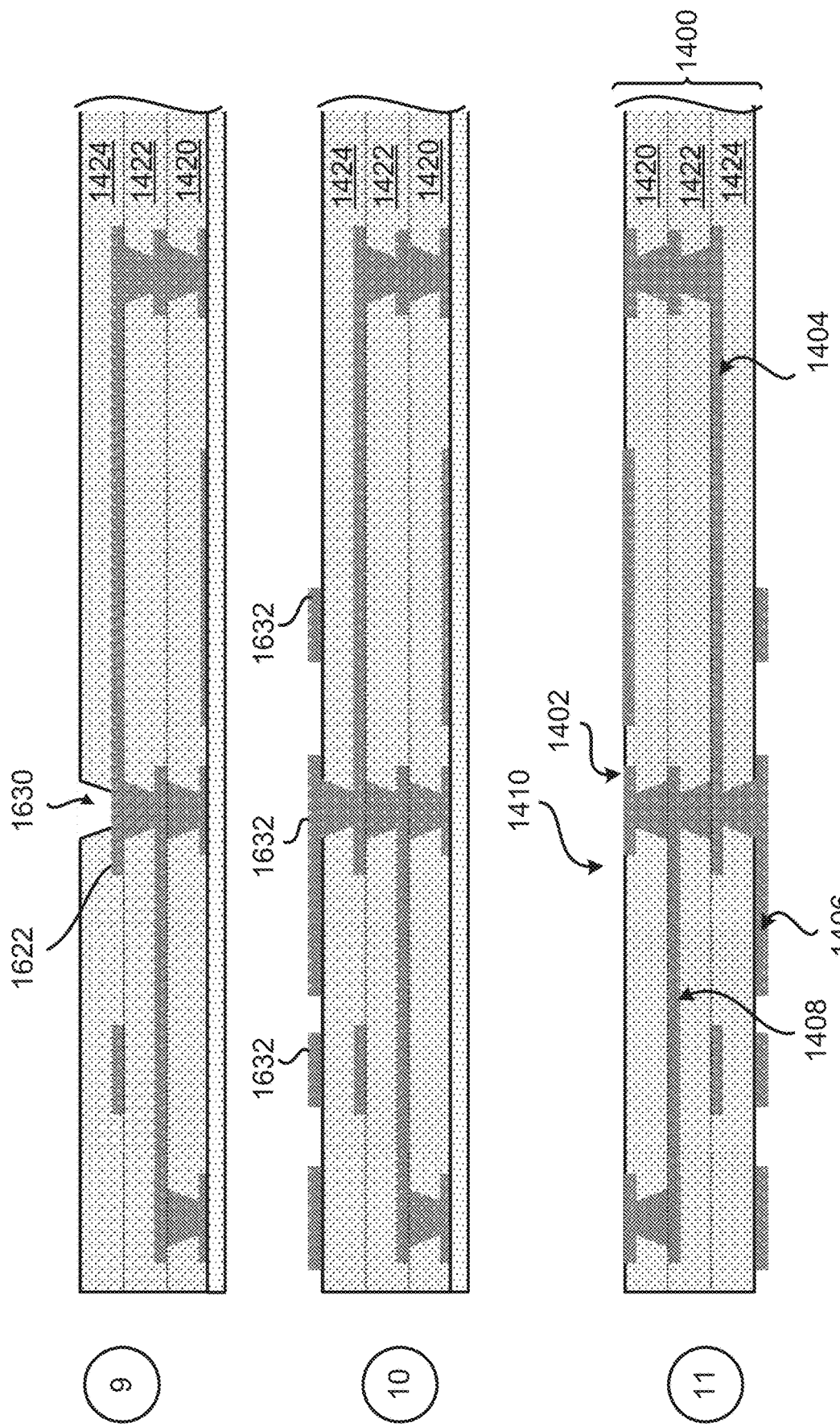

SUBSTRATE COMPRISING AN INDUCTIVE COUPLER FOR SIGNAL LEAKAGE REDUCTION

CROSS-REFERENCE TO RELATED APPLICATION

The present application claims priority to and is a divisional application to U.S. patent application Ser. No. 16/422,174, filed on May 24, 2019 in the U.S. Patent and Trademark Office, the entire content of U.S. patent application Ser. No. 16/422,174 is incorporated herein by reference as if fully set forth below and for all applicable purposes.

BACKGROUND

Field

Various features relate to substrates, but more specifically to substrates that include an inductive coupler for signal leakage reduction for a radio frequency (RF) filter.

Background

Many communication devices use an antenna, a transmitter, and a receiver to communicate through a transmission medium, with other communication devices. Often, these communication devices communicate through a medium that is congested with many signals. The number of signals can affect the quality of the communication between these devices. To address the many signals that are present in the transmission medium, filters may be used to isolate signals and filter out certain signals. However, these filters have limitations and drawbacks, such as signal leakage.

Therefore, there is a need for providing communication devices and filters with reduced signal leakage.

SUMMARY

Various features relate to substrates, but more specifically to substrates that include an inductive coupler for signal leakage reduction for a radio frequency (RF) filter.

One example provides a substrate that includes at least one dielectric layer and an inductive coupler formed in the at least one dielectric layer. The inductive coupler includes a first inductor and a second inductor. The first inductor is formed in the at least one dielectric layer. The first inductor is configured to be coupled to a transmitter filter and an antenna. The second inductor is formed in the at least one dielectric layer. The second inductor is configured to be coupled to the transmitter filter and ground. The second inductor is configured to provide a path to ground for a rejected signal having a rejected frequency. The second inductor is configured such that the rejected signal traveling through the second inductor causes the first inductor to generate an induced signal that counteracts a leakage signal traveling through the transmission filter.

Another example provides an apparatus that includes a die comprising a transmission filter; and a substrate coupled to the die. The substrate includes at least one dielectric layer and means for inductive coupling. The means for inductive coupling includes means for first inductance formed in the at least one dielectric layer, where the means for first inductance is coupled to the transmitter filter and an antenna. The means for inductive coupling includes means for second inductance formed in the at least one dielectric layer. The means for second inductance is coupled to the transmitter filter and ground. The means for second inductance is configured to provide a path to ground for a rejected signal having a rejected frequency. The means for second inductance is configured such that the rejected signal traveling through the means for second inductance causes the means for first inductance to generate an induced signal that counteracts a leakage signal traveling through the transmission filter.

Another example provides a method for fabricating a substrate. The method provides an inductive coupler with a substrate. The method of providing the inductive coupler includes providing a first inductor formed in the at least one dielectric layer, wherein the first inductor is coupled to a transmitter filter and an antenna. The method of providing the inductive coupler includes providing a second inductor formed in the at least one dielectric layer. The second inductor is coupled to the transmitter filter and ground. The second inductor is configured to provide a path to ground for a rejected signal having a rejected frequency. The second inductor is configured such that the rejected signal traveling through the second inductor causes the first inductor to generate an induced signal that counteracts a leakage signal traveling through the transmission filter.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a substrate that includes at least one dielectric layer and an inductive coupler formed in the at least one dielectric layer. The inductive coupler includes a first inductor and a second inductor. The first inductor is formed in the at least one dielectric layer. The first inductor is coupled to a transmitter filter and an antenna. The second inductor is formed in the at least one dielectric layer. The second inductor is coupled to the transmitter filter and ground. The second inductor is configured to provide a path to ground for a rejected signal having a rejected frequency. The second inductor is configured such that the rejected signal traveling through the second inductor causes the first inductor to generate an induced signal that counteracts a leakage signal traveling through the transmission filter. The leakage signal travels towards a receiving filter. The leakage signal travels through an impedance matching component when traveling towards the receiving filter. The substrate may be implemented in a radio frequency front end (RFFE) device.

Exemplary Circuit Diagram for Leakage Signal Reduction

Figure 1:
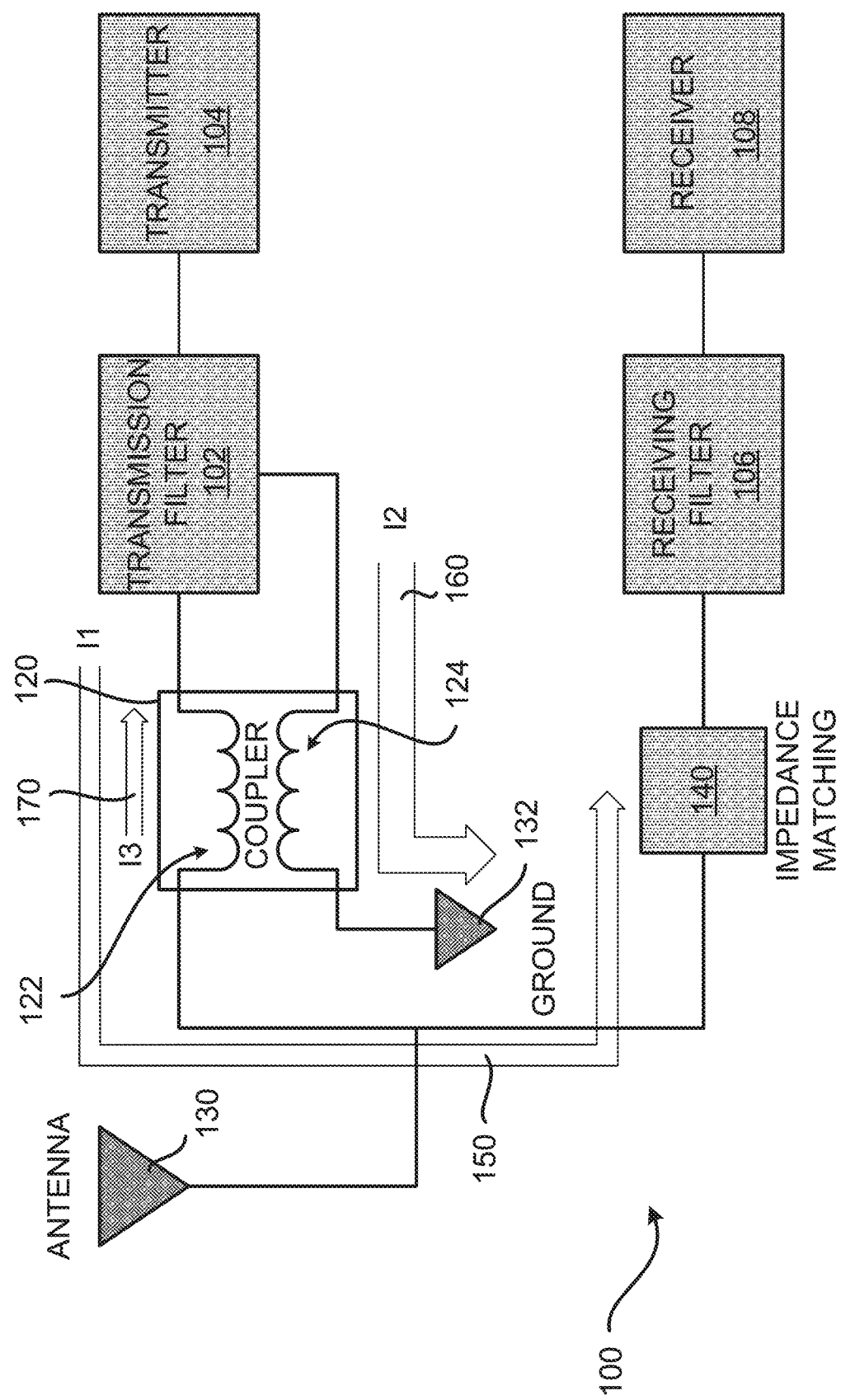
FIG. 1 illustrates an exemplary circuit diagram for reducing signal leakage for a transmission filter.

FIG. 1 illustrates an exemplary circuit configuration 100 for leakage signal reduction during the transmitting and receiving of signals by a communication device. The circuit configuration 100 includes a transmission filter 102, a transmitter 104, a receiving filter 106, a receiver 108, an inductive coupler 120, an antenna 130 and an impedance matching component 140. The inductive coupler 120 includes a first inductor 122 and a second inductor 124. The circuit configuration 100 may be implemented in a device with communication functionality, such a mobile device, a laptop, an internet of things (IoT) device and/or a vehicle.

The transmitter 104 is electrically coupled to the transmission filter 102. The transmission filter 102 is electrically coupled to inductive coupler 120. The inductive coupler 120 is electrically coupled to the antenna 130 and the impedance matching component 140. The antenna 130 is electrically coupled to the impedance matching component 140. The impedance matching component 140 is electrically coupled to the receiving filter 106. The receiving filter 106 is electrically coupled to the receiver 108.

As shown in FIG. 1, the first inductor 122 is electrically coupled to the antenna 130 and the transmission filter 102. The second inductor 124 is electrically coupled to the transmission filter 102 and to ground (which is represented by a ground terminal 132).

The transmission filter 102 is configured to perform signal processing on signals from the transmitter 104. An example of signal processing includes removing unwanted components or features of signals, including partial or complete suppression of some aspects of signals. The transmission filter 102 may for example remove or suppress signals from certain frequencies. Examples of signal processing for the transmission filter 102 include low pass filtering, high pass filtering, band pass filtering and band stop filtering. However, other types of signal processing may be performed by the transmission filter 102. The signals (e.g., transmission signals) that have been processed by the transmission filter 102 may travel to the antenna 130, through the inductive coupler 120.

The receiving filter 106 is configured to perform signal processing on signals from the antenna 130. The signals from the antenna 130 may travel through the impedance matching component 140. The impedance matching component 140 may include resistive components(s) and/or inductive component(s). The receiving filter 106 is similar to the transmission filter 102 in that the receiving filter 106 may perform signal processing, such as removing unwanted components or features of signals, including partial or complete suppression of some aspects of signals. Examples of signal processing for the receiving filter 106 include low pass filtering, high pass filtering, band pass filtering and band stop filtering. However, other types of signal processing may be performed by the receiving filter 106. The signals (e.g., receiving signals) that have been processed by the receiving filter 106 may travel to the receiver 108 for further processing.

FIG. 1 illustrates an example of how signals may travel through the circuit configuration 100. In an example where the transmission filter 102 is configured to filter out or reject a particular signal (e.g., rejected signal) with a particular frequency (e.g., rejected frequency), a majority of that particular signal (e.g., rejected signal) may travel to the ground terminal 132 through the second inductor 124. However, some of that particular signal (e.g., rejected signal) with that particular frequency (which is supposed to travel to ground) may leak through from the transmission filter 102 and travel to the first inductor 122 and towards the receiving filter 106, which can affect and interfere with signals from the antenna 130 to the receiving filter 106 and/or the receiver 108.

FIG. 1 illustrates a rejected signal 160 (which is represented as a rejected current (I2)) that the transmission filter 102 is configured to reject and filter out through the second inductor 124 and towards the ground terminal 132. A rejected signal may be a signal that has a particular frequency that is to be rejected. The transmission filter 102 may be configured to filter out and reject signals from many frequencies (e.g., first rejected signal having a first rejected frequency, second rejected signal having a second rejected frequency). However, for the purpose of clarity, FIG. 1 only illustrates signals at a particular rejected frequency. Signals that do not have a particular rejected frequency (which are not shown) are allowed to pass through to the first inductor 122. A majority of a signal with a rejected frequency may be filtered out towards the ground terminal 132. However, as mentioned above, there may be a small amount of leakage signal that may be able to pass through the transmission filter 102.

FIG. 1 illustrates a leakage signal 150 (which is represented as a leakage current (I1)) traveling from the transmission filter 102, through the first inductor 122 of the inductive coupler 120 and towards the impedance matching component 140 and the receiving filter 106. The leakage signal 150 represents a signal that the transmission filter 102 is configured to reject and filter out towards the ground terminal 132, but is a signal that was able to pass through to the first inductor 122. The leakage signal 150 may be a signal that has the same frequency as the rejected signal 160. The leakage signal 150 is problematic because it may travel towards the receiving filter 106 and/or the receiver 108, and interfere with other signals from the antenna 130.

To address the leakage signal 150, the inductive coupler 120 is configured to generate an induced signal 170, which can offset or counteract the leakage signal. The induced signal 170 (which is represented as an induced current (I3)) may have the same or similar frequency as the leakage signal 150 but has a reverse phase to the leakage signal 150. In some implementations, the induced signal 170 may have the same or similar frequency as the leakage signal 150 but travels in an opposite direction to the leakage signal 150. The magnitude or strength of the induced signal 170 may be strong enough to reduce or cancel out the leakage signal 150, which then reduces or eliminates the leakage signal 150 that may travel to the receiving filter 106, thereby improving isolation between the transmission signals and the receiving signals.

The induced signal 170 is generated by using the rejected signal 160 traveling through the second inductor 124. When the rejected signal 160 travels though the second inductor 124, the second inductor 124 causes the first inductor 122 to generate the induced signal 170. It is noted that different rejected signals with different rejected frequencies may produce induced signals with different rejected frequencies. For example, during a first time period, a first rejected signal having a first rejected frequency may cause a first induced signal with the first rejected frequency to be generated, to counteract a first leakage signal having the first rejected frequency. During a second time period, a second rejected signal having a second rejected frequency may cause a second induced signal with the second rejected frequency to be generated, to counteract a second leakage signal having the second rejected frequency.

The configurations, sizes, and shapes of the first inductor 122 and the second inductor 124 may be configured such that the magnitude of the induced signal 170 is similar to the leakage signal 150. Thus, this configuration uses signals that are otherwise rejected in order to further improve the performance of the transmission filter 102 and provide additional isolation capabilities between transmission signals and receiving signals. The approach to providing isolation in the present disclosure is counterintuitive because other approaches tend to design the path of the rejected signals to ground to be as far as possible from the path of signals that are allowed pass through so that they don't interfere with one another. In some implementations, the amount of isolation between the transmission filter and the receiving filter may be good enough such that a shield (e.g., electromagnetic (EMI) shield) between the transmission filter and the receiving filter is not necessary.

Figure 3:
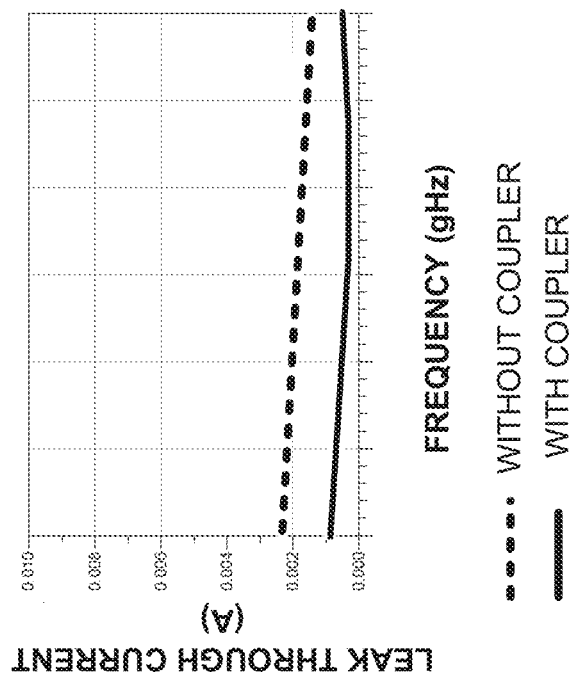
FIG. 3 illustrates another exemplary chart of signal leakage for a transmission filter with and without signal leakage control.
Figure 2:
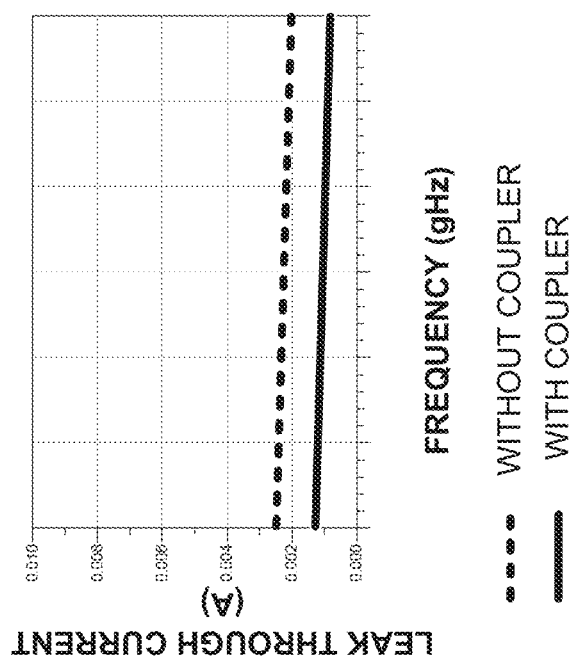
FIG. 2 illustrates an exemplary chart of signal leakage for a transmission filter with and without signal leakage control.

FIGS. 2 and 3 illustrate exemplary graphs of leakage signals for filters with and without an inductive coupler. As shown in FIGS. 2 and 3, the leakage signal (which is listed in ampere (A)) for certain frequencies are reduced by 50% percent or more, when an inductive coupler such as the one described in FIG. 1 is used in conjunction with a transmission filter. It is noted that the inductive coupler may work differently for signal with different frequencies. Similarly, different inductive couplers may work differently on different signals. Thus, the graphs of FIGS. 2 and 3 are merely exemplary representations of possible leakage signal reductions for various signals with different frequencies.

Figure 4:
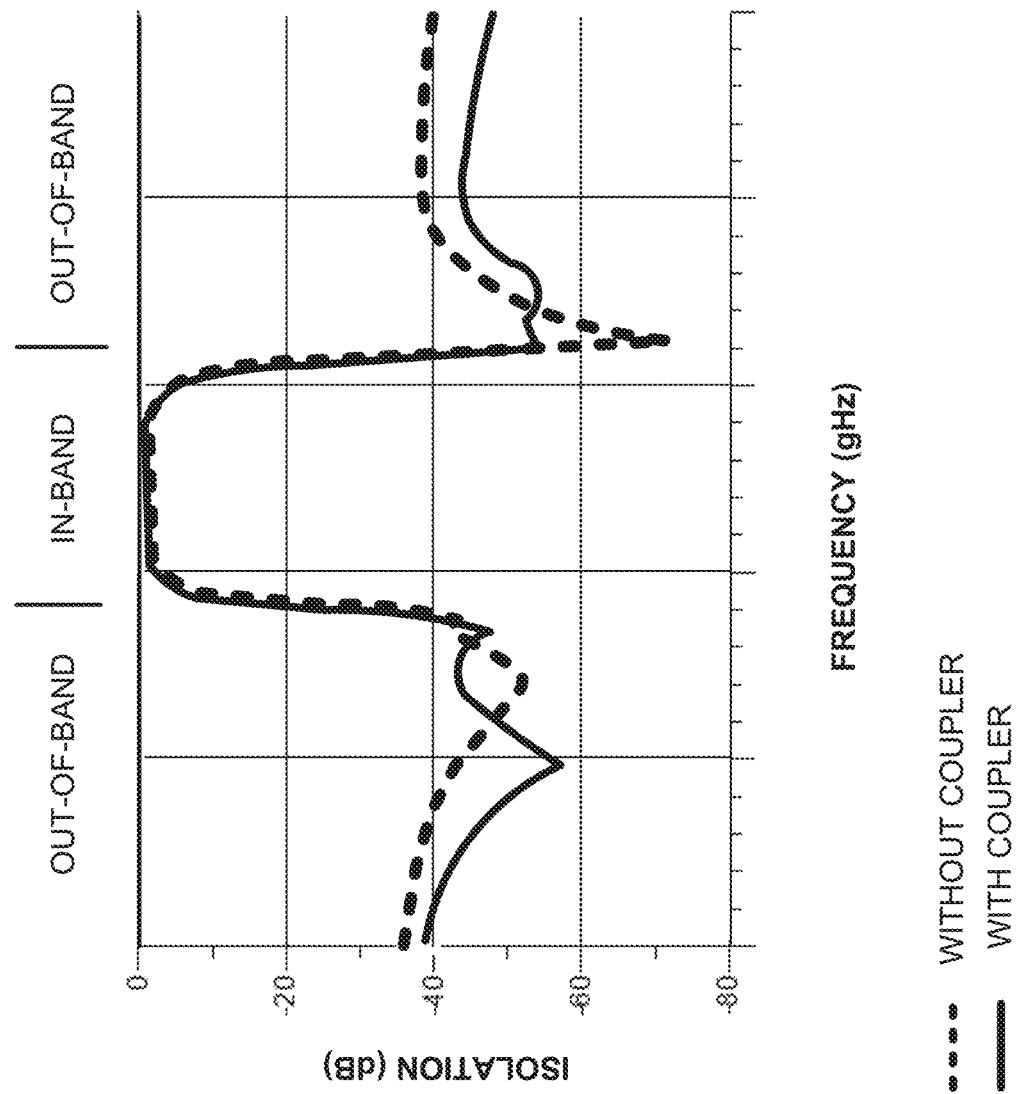
FIG. 4 illustrates an exemplary chart of isolation performance of a transmission filter with and without signal leakage control.

FIG. 4 illustrates an exemplary graph of how much isolation is between a transmission filter and a receiving filter with and without the use of an inductive coupler as described in FIG. 1. FIG. 4 illustrates that for in band frequencies, the isolation is about the same or similar whether or not there is an inductive coupler. However, for out of band frequencies, there is an improvement in isolation with the use of an inductive coupler. For example, for out of band frequencies, more of the frequencies have isolation of at least −50 decibels (dB) when an inductive coupler is used with a filter (radio frequency (RF) filter). For purpose of clarity, FIGS. 2, 3, and 4 do not illustrate the specific frequencies at which signal leakage is reduced through the use of the coupler. However, the coupler may be designed to reduce signal leakage for any signal frequency.

Figure 5:
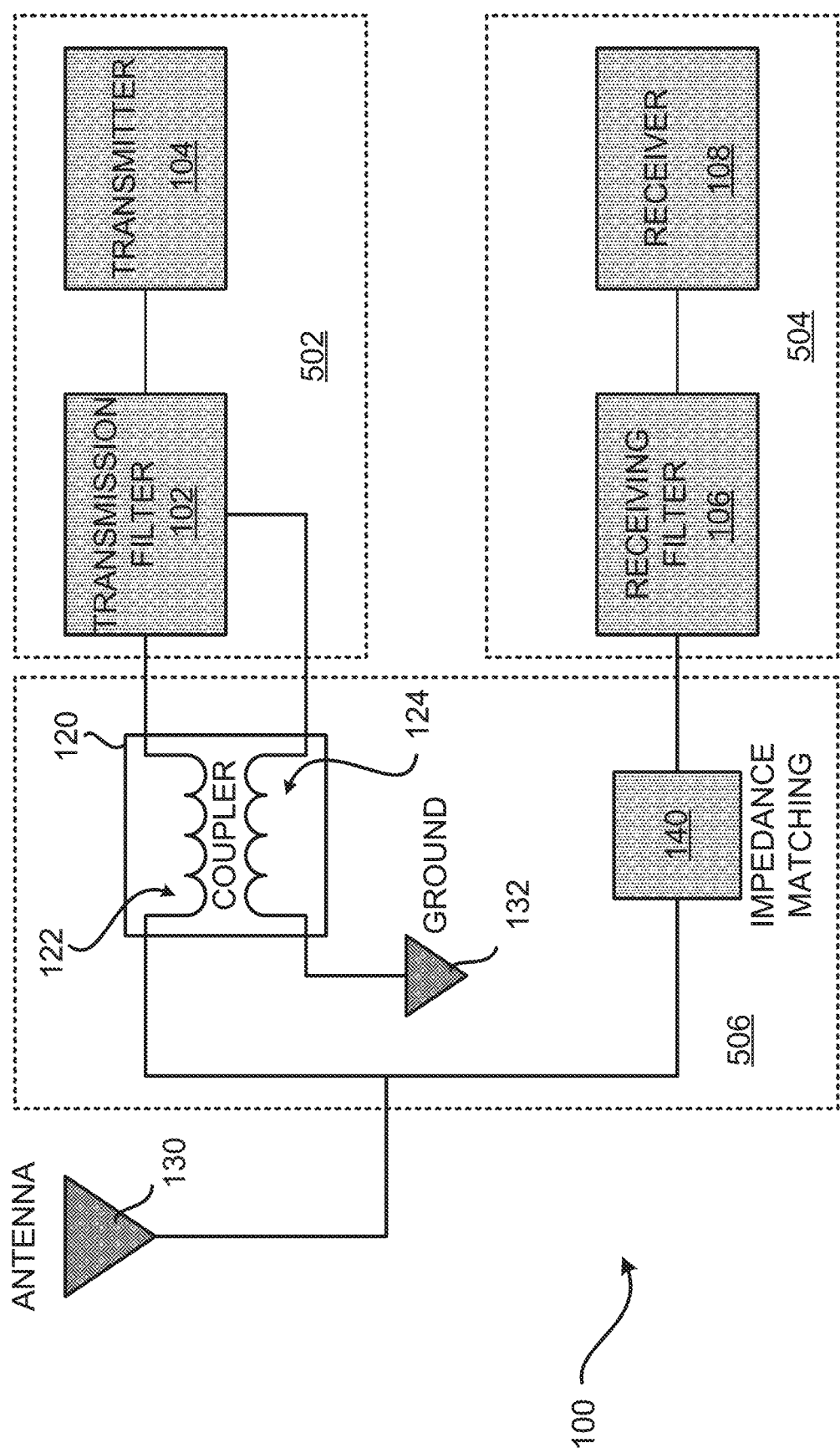
FIG. 5 illustrates another exemplary circuit diagram for reducing signal leakage implemented with a substrate.

FIG. 5 illustrates an exemplary circuit configuration 100 for leakage signal reduction implemented with a substrate. As shown in FIG. 5, the circuit configuration 100 is implemented with a die 502 (e.g., first die), a die 504 (e.g., second die) and a substrate 506. The die 502 may include the transmission filter 102 and the transmitter 104. The die 504 may include the receiving filter 106 and the receiver 108. The die 502 and the die 504 may be coupled to the substrate 506.

Different implementations may use different types of substrates. The substrate 506 may be a laminate substrate, which is further described below. The substrate 506 may include the inductive coupler 120, which includes the first inductor 122 and the second inductor 124. The inductive coupler 120 may be formed by interconnects in and/or over the substrate 506. An exemplary configuration of the inductive coupler 120 in a substrate is further described below in at least FIGS. 7-13. The substrate 506 may also include the impedance matching component 140. The impedance matching component 140 may be formed by interconnects. FIG. 5 illustrates that the antenna 130 is outside of the substrate 506. However, in some implementations, the antenna 130 may be implemented in and/or over the substrate 506.

Figure 6:
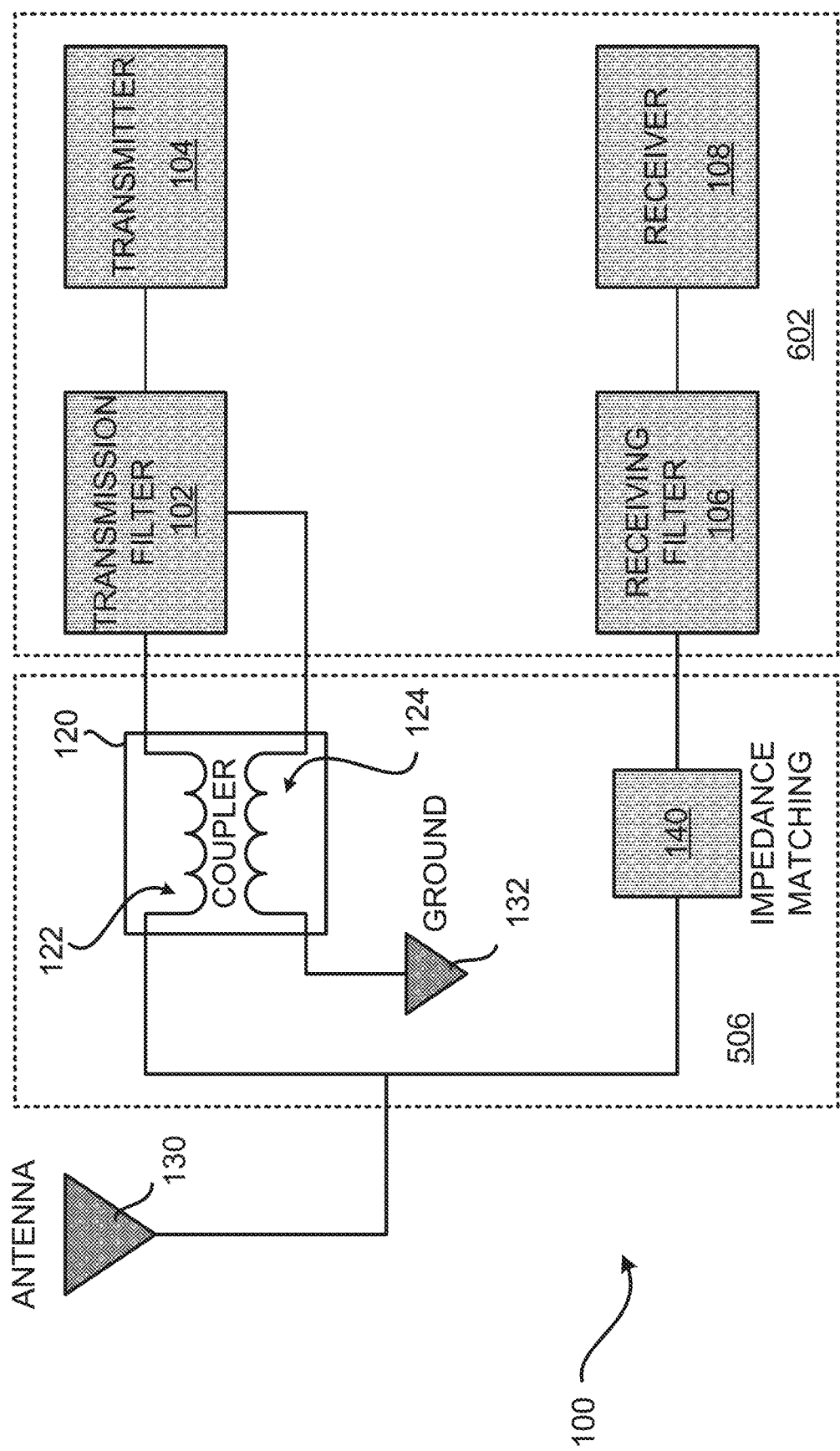
FIG. 6 illustrates another exemplary circuit diagram for reducing signal leakage implemented with a substrate.

FIG. 6 illustrates another exemplary circuit configuration 100 for leakage signal reduction implemented with another substrate. As shown in FIG. 6, the circuit configuration 100 is implemented with a die 602 (e.g., first die) and the substrate 506. The die 602 may include the transmission filter 102, the transmitter 104, the receiving filter 106 and the receiver 108. The die 602 may be coupled to the substrate 506.

In some implementations, the various components of a transmitter, receiver, transmission filter, receiving filter, coupler and/or impedance matching component may be implemented in more than two dies and/or the substrate.

Exemplary Inductive Coupler for Leakage Signal Reduction

Figure 7:
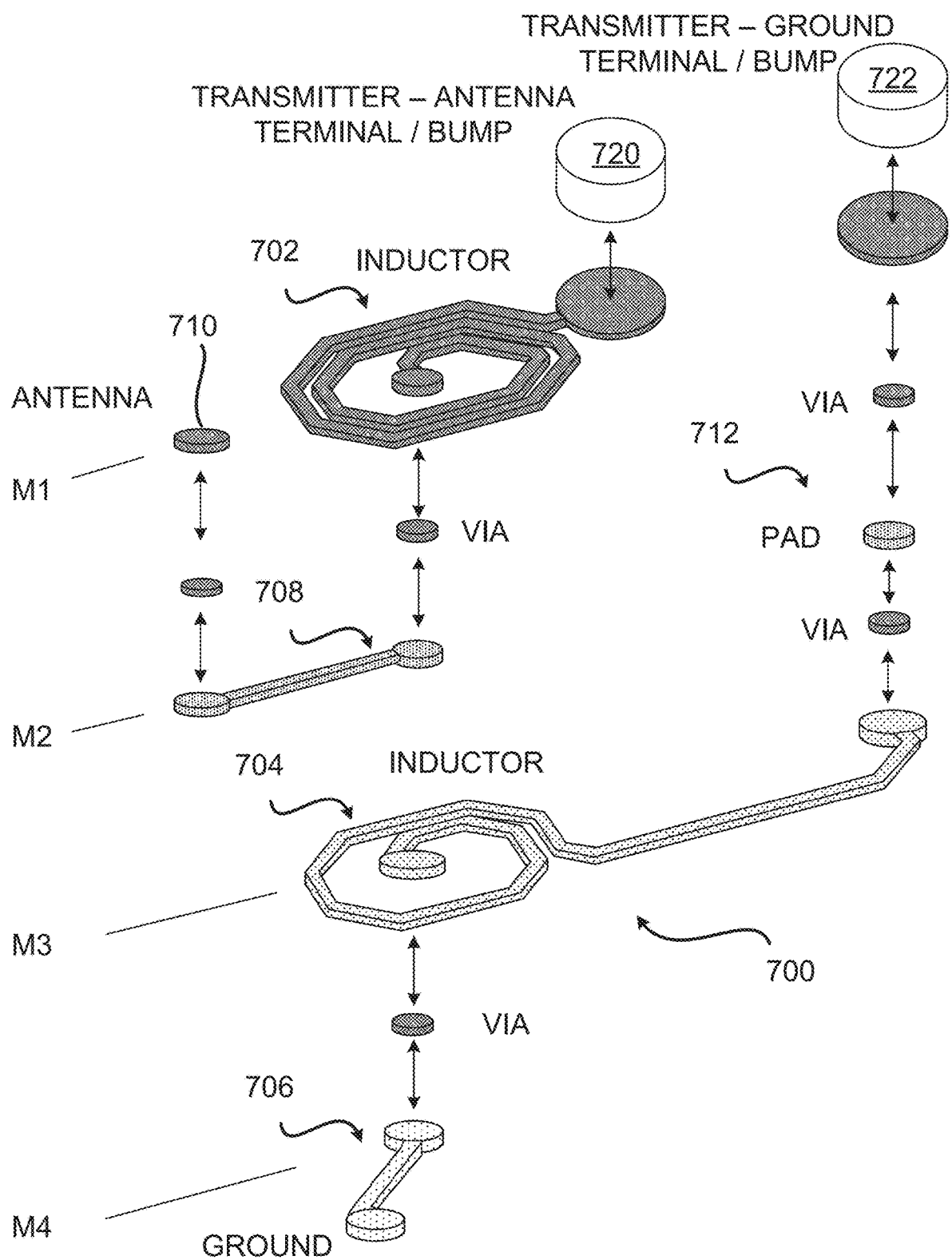
FIG. 7 illustrates a view of an exemplary inductive coupler for signal leakage control.

FIG. 7 illustrates a view of an inductive coupler 700 implemented in a substrate. The inductive coupler 700 may be an example of a physical representation of the inductive coupler 120. The inductive coupler 700 may be a means for inductive coupling. The inductive coupler 700 includes the inductor 702 (e.g., first inductor, means for first inductance) and the inductor 704 (e.g., second inductor, means for second inductance). The inductor 702 may be an example of a physical representation of the inductor 122, and the inductor 704 may be an example of a physical representation of the inductor 124.

The inductor 702 may be formed by one or more interconnects. Similarly, the inductor 704 may be formed by one or more interconnects. The inductor 702 is formed on a first metal (M1) layer of a substrate. The inductor 702 is coupled to a transmission filter and antenna terminal 720. The transmission filter and an antenna terminal 720 may include a bump. The transmission filter and an antenna terminal 720 may be coupled to a transmission filter (e.g., 102). The inductor 702 is further coupled to an antenna terminal 710 through one or more interconnects 708. The antenna terminal 710 may be coupled to an antenna (e.g., 130). The antenna terminal 710 may be located on the first metal (M1) layer of the substrate. The interconnects 708 that are coupled the inductor 702 and the antenna terminal 710 may include interconnects (e.g., trace, pad) on a second metal (M2) layer of the substrate and via(s) between the M1 and M2.

The inductor 704 is formed on a third metal (M3) layer of the substrate. The inductor 704 is coupled to a transmission filter and a ground terminal 722, through one or more interconnects 712 (e.g., pad, via, trace). The transmission filter and ground terminal 722 may include a bump. The transmission filter and ground terminal 722 may be coupled to a transmission filter (e.g., 102). The inductor 704 may be coupled to one or more interconnects 706 coupled to a ground terminal. The one or more interconnects 706 may be ground interconnects. The one or more interconnects 706 may be formed on a fourth metal (M4) layer of a substrate. Although not shown, the inductive coupler 700, the inductor 702 and the inductor 704 may be implemented in one or more dielectric layers of a substrate. It is noted that the metal layers (e.g., M1, M2, M3, M4) of the substrate are merely exemplary. Different implementations may position the various components on different metal layers of the substrate.

Figure 8:
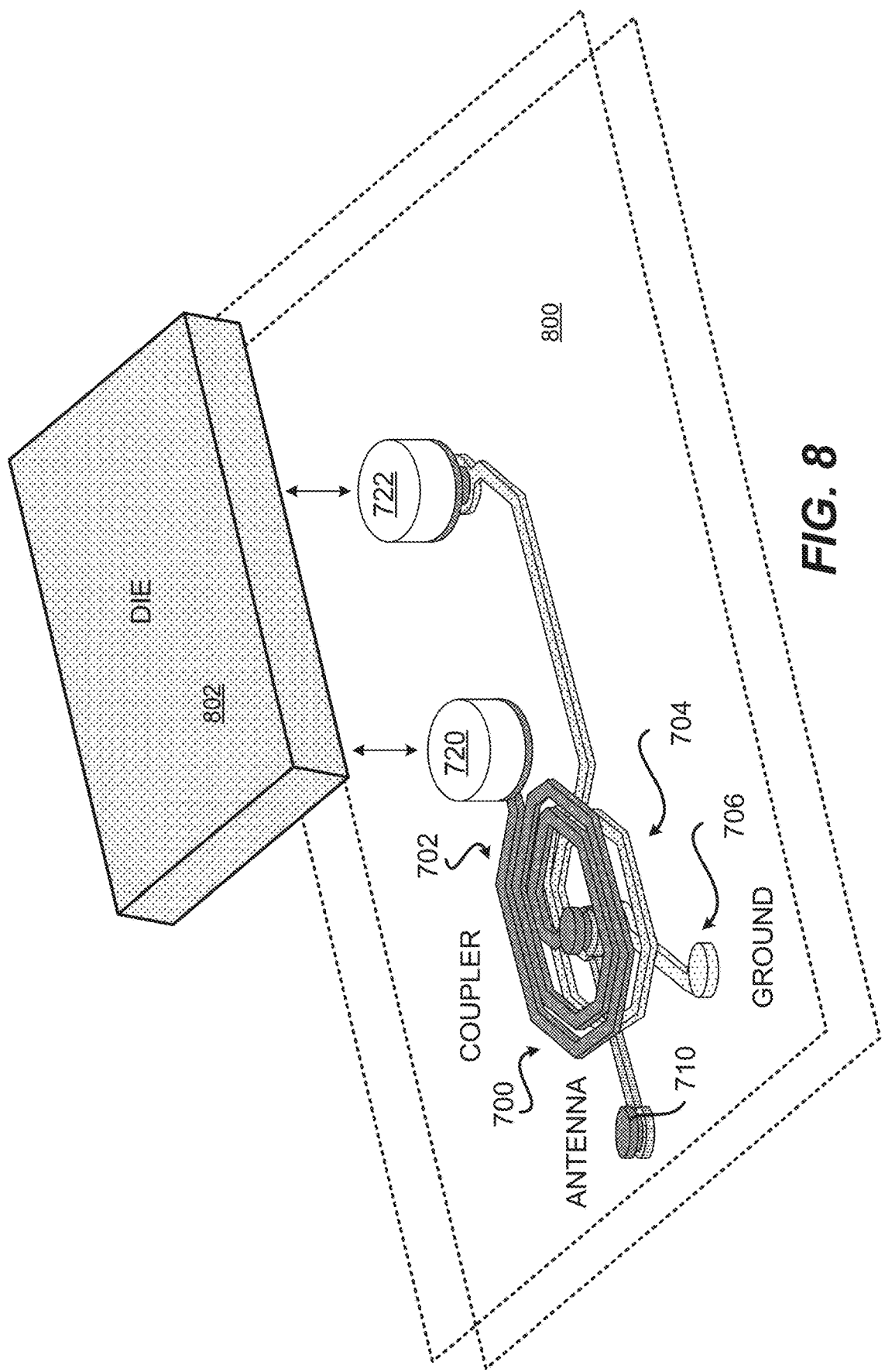
FIG. 8 illustrates a view of an exemplary substrate with an inductive coupler for signal leakage control coupled to a die that includes transmission filtering.

FIG. 8 illustrates an angled view of a substrate 800 coupled to a die 802. The substrate 800 includes the inductive coupler 700, the inductor 702, the inductor 704, the interconnects 706 coupled to ground, the antenna terminal 710, the transmission filter and antenna terminal 720, and the transmission filter and ground terminal 722. The die 802 may include a transmission filter and a transmitter as described in FIG. 5. In some implementations, the die 802 may include a transmission filter (e.g., 102), a transmitter (e.g., 104), a receiving filter (e.g., 106) and a receiver (e.g., 108) as described in at least FIG. 6. The die 802 is coupled to the substrate 800 through the terminal 720 and the terminal 722.

Figure 9:
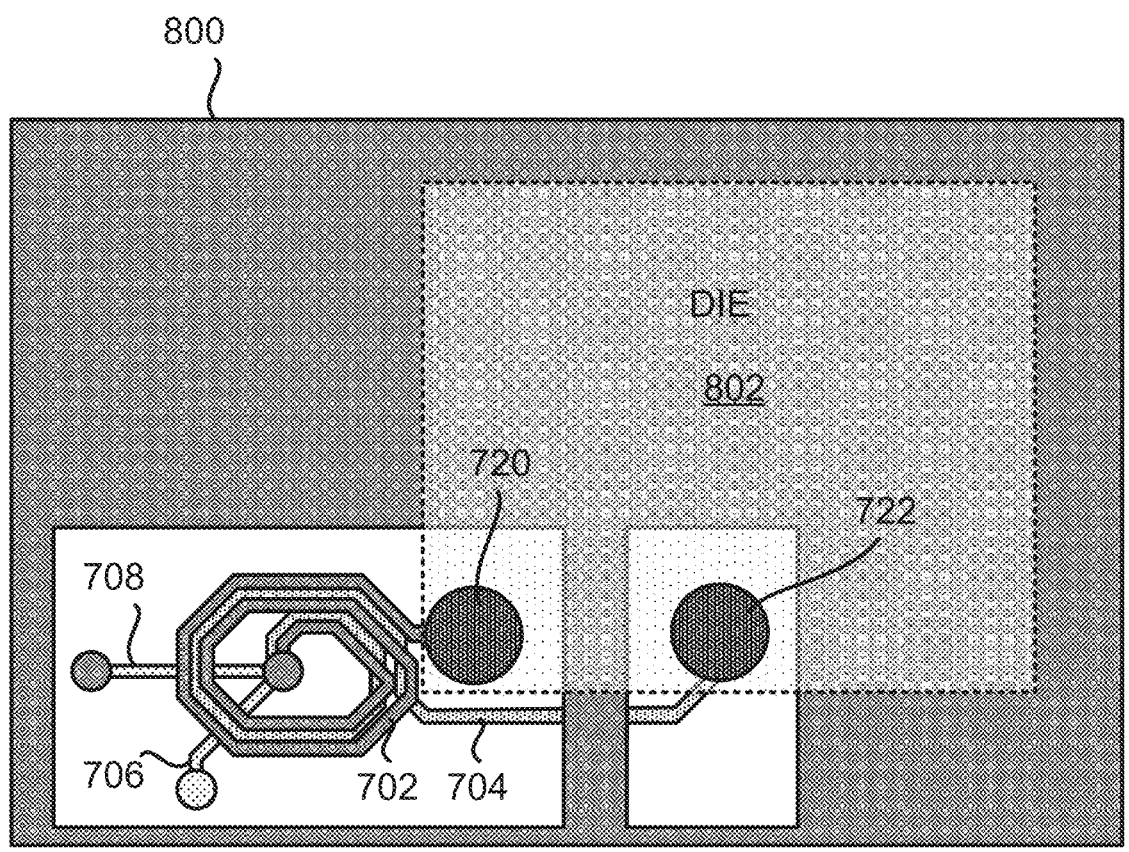
FIG. 9 illustrates a plan view of an exemplary substrate with an inductive coupler for signal leakage control coupled to a die that includes transmission filtering.
Figure 10:
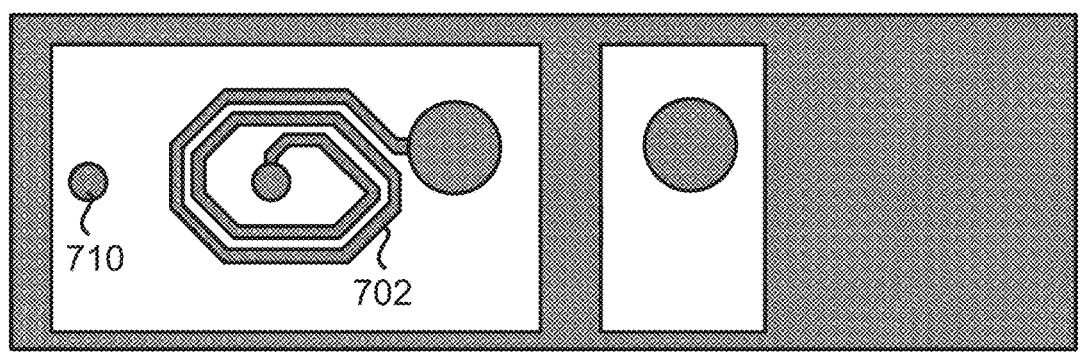
FIG. 10 illustrates a plan view of a metal layer of an exemplary substrate with an inductive coupler for signal leakage control.
Figure 11:
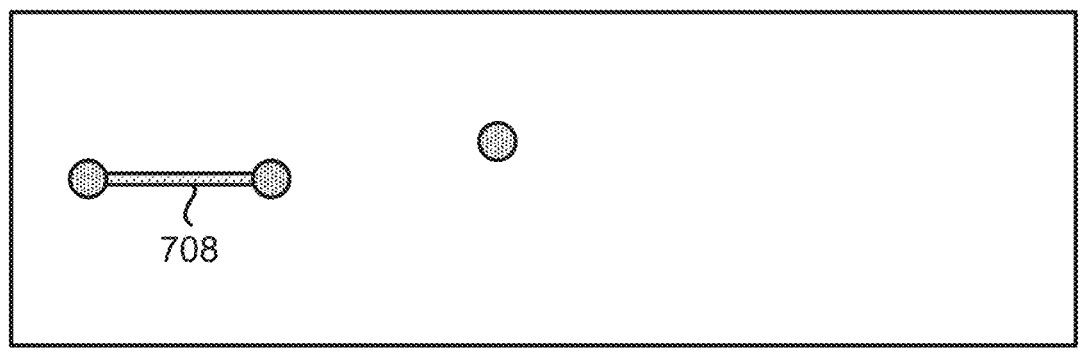
FIG. 11 illustrates a plan view of another metal layer of an exemplary substrate with an inductive coupler for signal leakage control.
Figure 12:
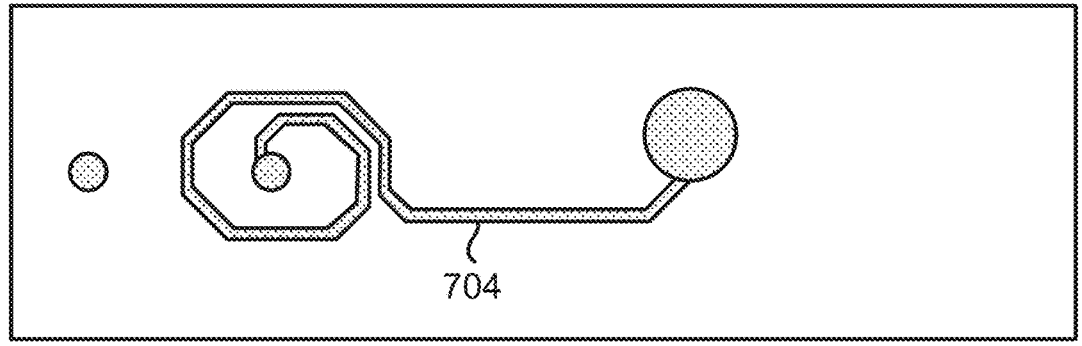
FIG. 12 illustrates a plan view of another metal layer of an exemplary substrate with an inductive coupler for signal leakage control.
Figure 13:
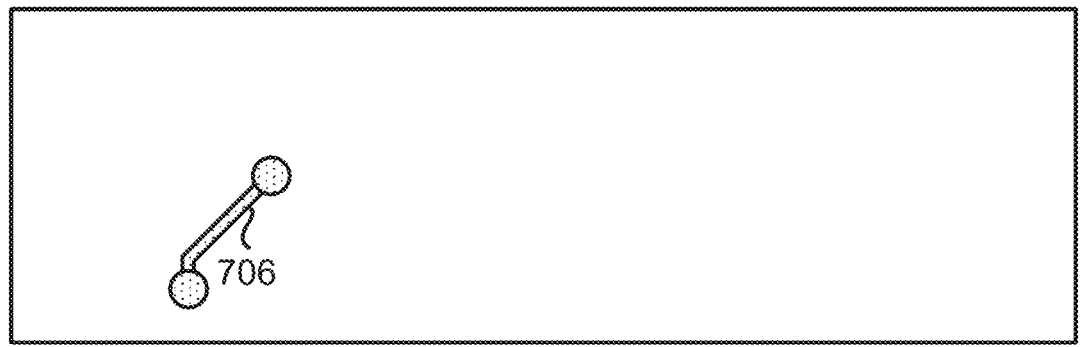
FIG. 13 illustrates a plan view of another metal layer of an exemplary substrate with an inductive coupler for signal leakage control.

FIG. 9 illustrates a plan view (e.g., top view) of the substrate 800 coupled to the die 802. The inductor 702 (which is formed by one or more interconnects) is positioned vertically over the inductor 704 (which is formed by one or more interconnects), such that there may be mutual inductance. FIG. 10 illustrates a plan view of a first metal (M1) layer of the substrate 800. The M1 layer includes the inductor 702 and the antenna terminal 710. FIG. 11 illustrates a plan view of a second metal (M2) layer of the substrate 800. The M2 layer includes the interconnects 708 that are coupled to the inductor 702 and the antenna terminal 710. FIG. 12 illustrates a plan view of a third metal (M3) layer of the substrate 800. The M3 layer includes the inductor 704. FIG. 13 illustrates a plan view of a fourth metal (M4) layer of the substrate 800. The M4 layer includes interconnects 706 coupled to ground and the inductor 704. FIGS. 7-13 illustrate an inductive coupler 700 formed on a substrate 800 that includes 4 metal layers (e.g., M1, M2, M3, M4). However, an inductive coupler (e.g., 700) may be formed on different numbers of metal layers of a substrate (e.g., less than 4 metal layers, more than 4 metal layers).

Figure 14:
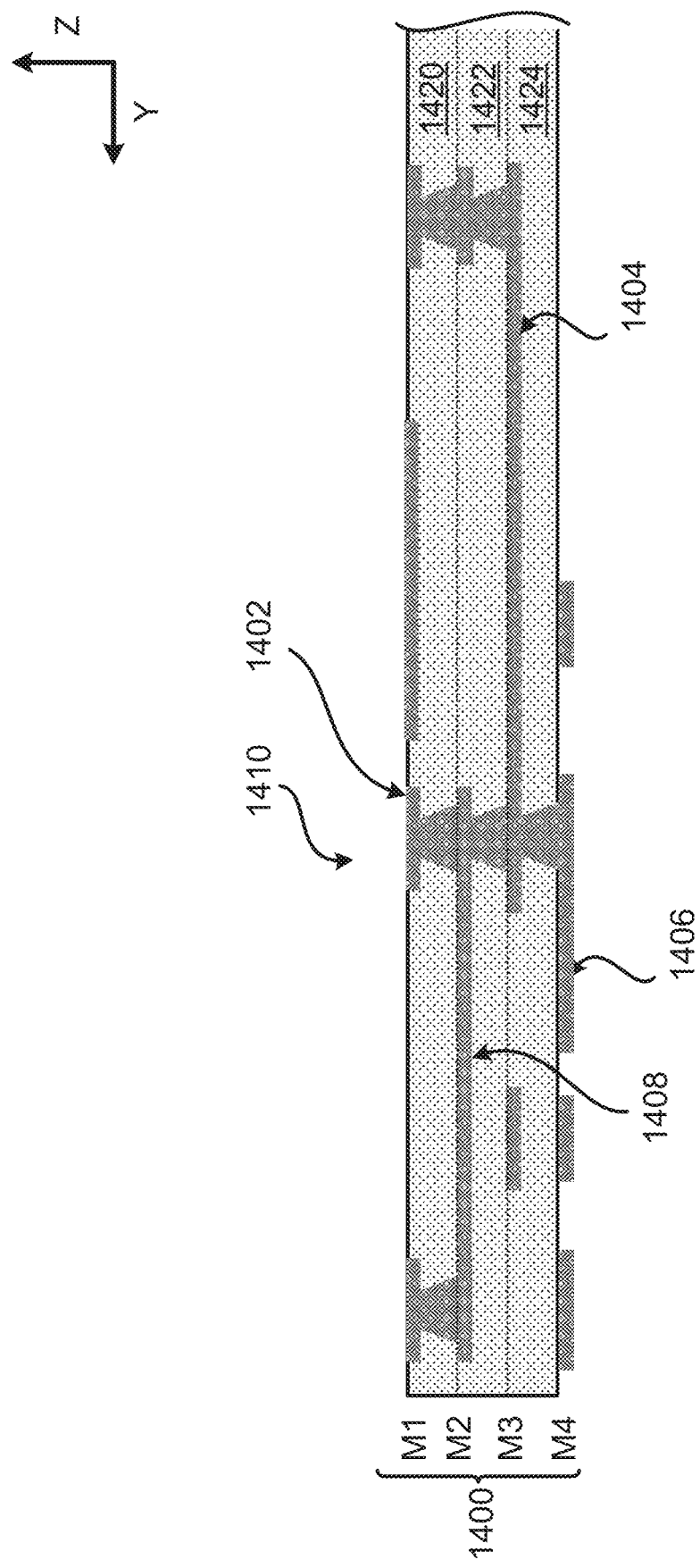
FIG. 14 illustrates a profile view of a substrate that includes an inductive coupler for leakage signal control.

FIG. 14 illustrates a profile view of a substrate 1400 that includes an inductive coupler as described in the disclosure. The substrate 1400 may be a laminate substrate. The substrate 1400 may include any of the inductive couplers and inductors described in the disclosure. As shown in FIG. 14, the substrate 1400 includes dielectric layers 1420, 1422, 1424, an inductive coupler 1410, an inductor 1402, an inductor 1404, a ground terminal 1406, an antenna terminal 1408. The inductive coupler 1410 may be formed by one or more interconnects on one or more metal layers. The inductor 1402 may be formed by one or more interconnects. The inductor 1404 may be formed by one or more interconnects. The ground terminal 1408 may be formed by one or more interconnects. The antenna terminal 1408 may be formed by one or more interconnects.

Figure 15:
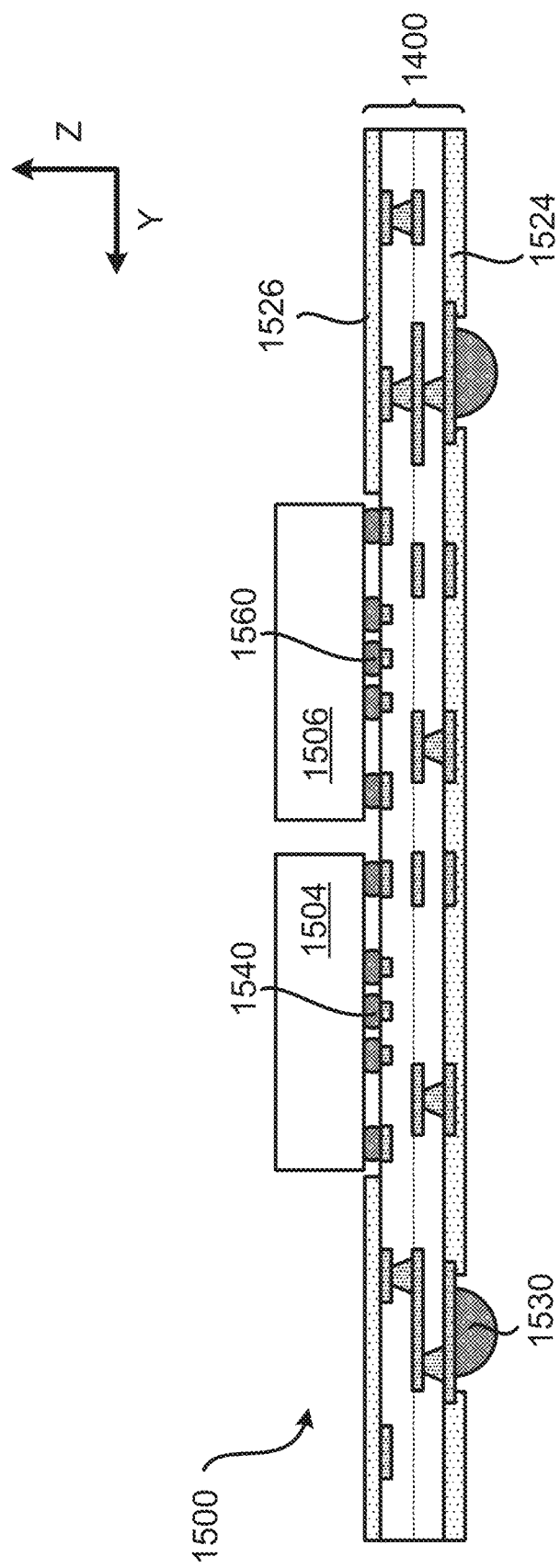
FIG. 15 illustrates a profile view of a substrate that includes an inductive coupler for leakage signal control, coupled to a die.

FIG. 15 illustrates a device 1500 that includes the substrate 1400, the die 1504 and the die 1506. The die 1504 (e.g., first die) may be similar to the die 502. The die 1504 may include a transmission filter and a transmitter. The die 1506 (e.g., second die) may be similar to the die 504. The die 1506 may include a receiving filter and a receiver. The substrate 1400 includes a first solder resist layer 1524, a second solder resist layer 1526, and a plurality of solder interconnects 1530. The die 1504 may be coupled to the substrate 1400 through a plurality of solder interconnects 1540. The die 1506 may be coupled to the substrate 1400 through a plurality of solder interconnects 1560. In some implementations, some or all of functionalities of the die 1504 and the die 1506 may be implemented as a single die, or may be implemented in more than two dies.

Exemplary a Substrate Comprising an Inductive Coupler

Figure 16A:
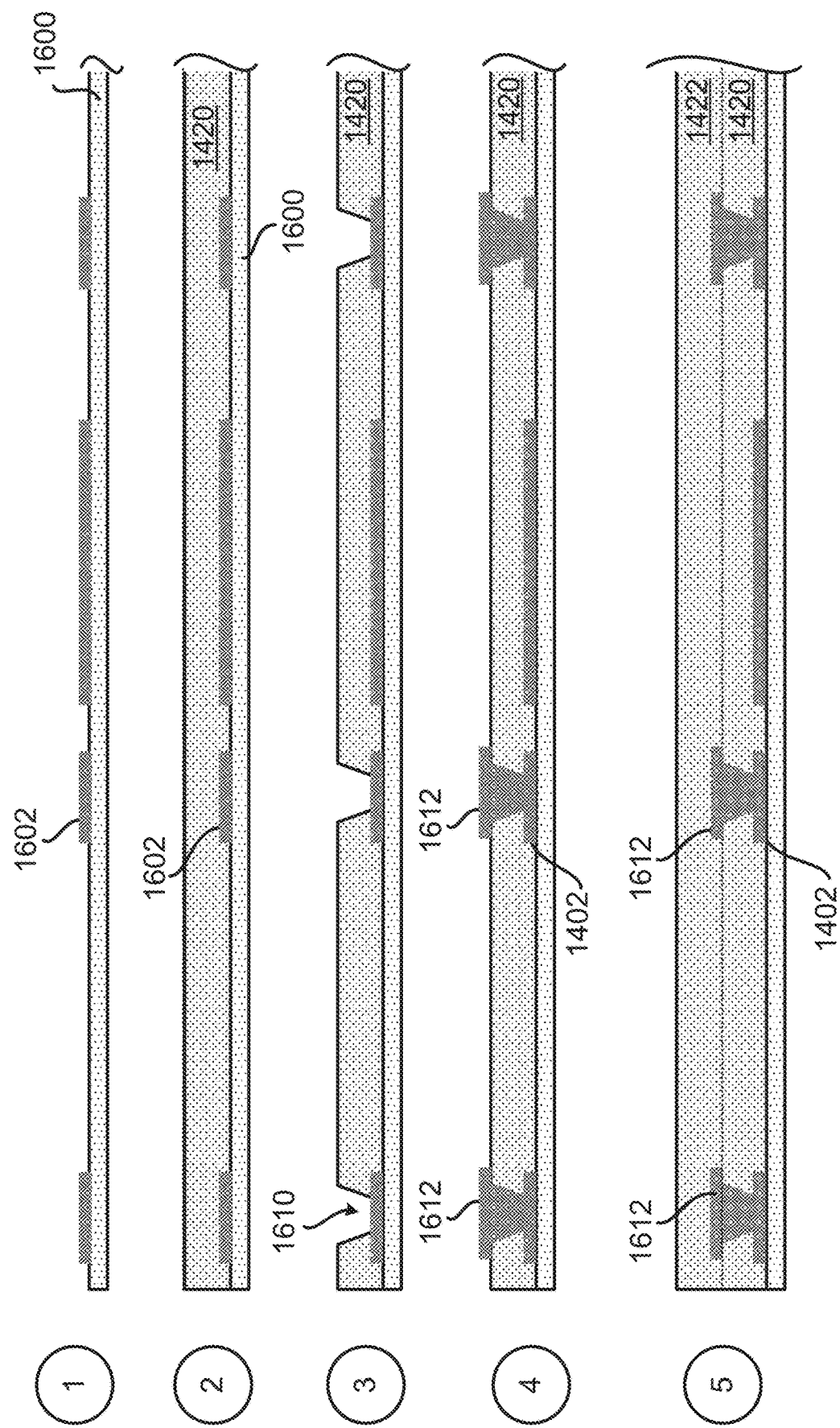
FIG. 16 (comprising FIGS. 16A-16C) illustrates an exemplary sequence for fabricating a substrate that includes an inductive coupler for leakage signal reduction.
Figure 16B:
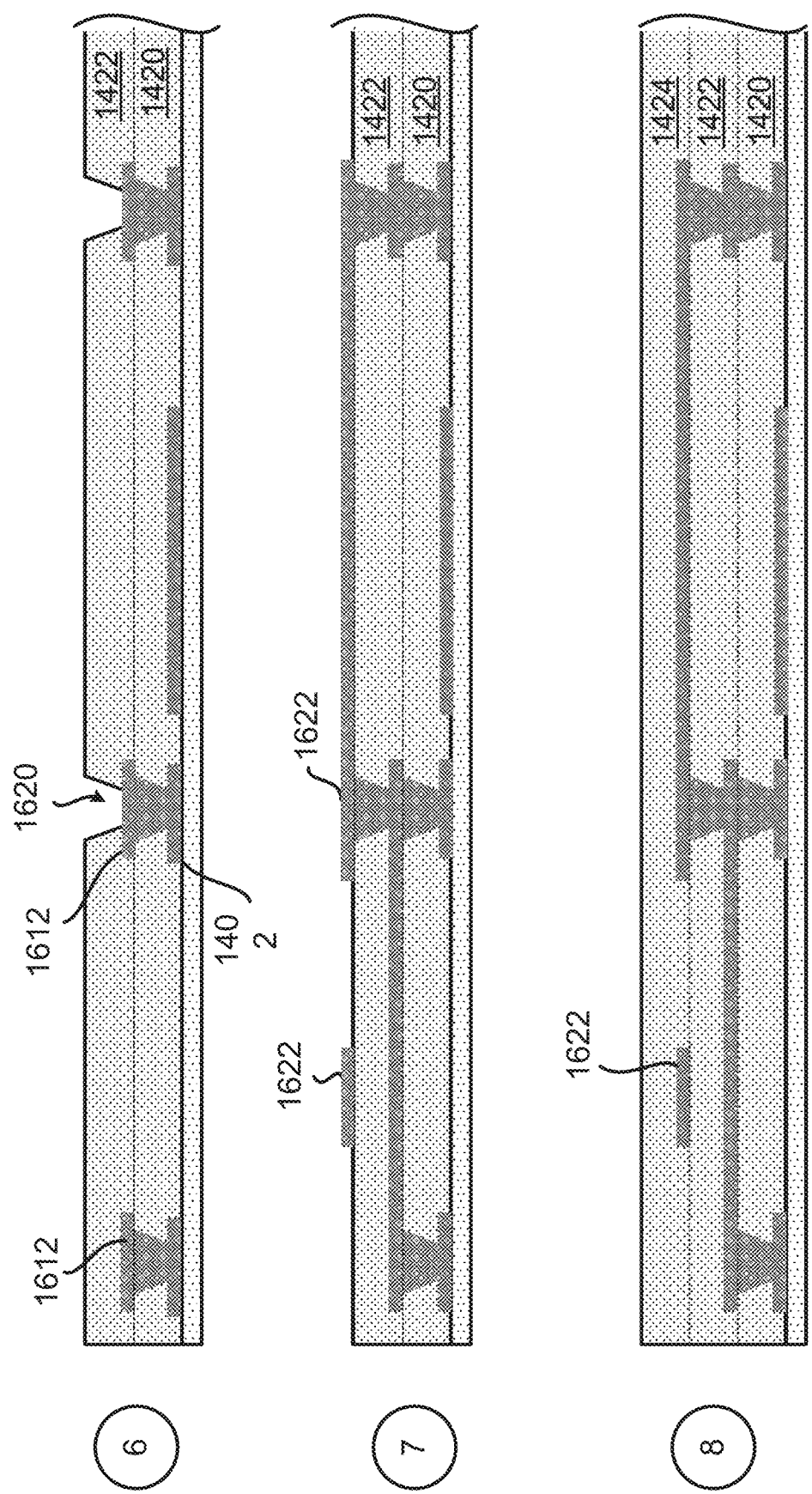

In some implementations, fabricating a substrate includes several processes. FIG. 16 (which includes FIGS. 16A-16C) illustrates an exemplary sequence for providing or fabricating a substrate that includes an inductive coupler. In some implementations, the sequence of FIGS. 16A-16C may be used to provide or fabricate the substrate 1400 with an inductive coupler of FIG. 14.

It should be noted that the sequence of FIGS. 16A-16C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 16A, illustrates a state after a carrier 1600 is provided and a metal layer is formed over the carrier 1300. The metal layer may be patterned to form interconnects 1602. A plating process may be used to form the metal layer and interconnects.

Stage 2 illustrates a state after a dielectric layer 1420 is formed over the carrier 1300 and the interconnects 1602. The dielectric layer 1420 may include polyimide.

Stage 3 illustrates a state after a plurality of cavities 1610 is formed in the dielectric layer 1420. The plurality of cavities 1610 may be formed using an etching process or laser process.

Stage 4 illustrates a state after interconnects 1612 are formed in and over the dielectric layer 1420. For example, a via, pad and/or traces may be formed. A plating process may be used to form the interconnects.

Stage 5 illustrates a state after another dielectric layer 1422 is formed over the dielectric layer 1420.

Stage 6, as shown in FIG. 16B, illustrates a state after a cavity 1620 is formed in the dielectric layer 1422. An etching process or laser process may be used to form the cavities 1620.

Stage 7 illustrates a state after interconnects 1622 are formed in and over the dielectric layer 1422. For example, via, pad and/or trace may be formed. A plating process may be used to form the interconnects.

Stage 8 illustrates a state after another dielectric layer 1424 is formed over the dielectric layer 1422.

Stage 9, as shown in FIG. 16C, illustrates a state after a cavity 1630 is formed in the dielectric layer 1424. An etching process or laser process may be used to form the cavities 1630.

Stage 10 illustrates a state after interconnects 1632 are formed in and over the dielectric layer 1424. For example, via, pad and/or trace may be formed. A plating process may be used to form the interconnects.

Stage 11 illustrates after the carrier 1600 is decoupled (e.g., removed, grinded out) from the dielectric layer 1420, leaving the substrate 1400 (e.g., coreless substrate). In some implementation, the coreless substrate is an embedded trace substrate (ETS). Stage 11 illustrates the substrate 1400 that includes the dielectric layer 1420, the dielectric layer 1422, and the dielectric layer 1424. In some implementations, the dielectric layer 1420, the dielectric layer 1422, and the dielectric layer 1424 may be considered as one dielectric layer (e.g., single dielectric layer). The substrate 1400 includes the inductive coupler 1410, the inductor 1402, the inductor 1404, the ground terminal 1406, and the antenna terminal 1408, which may each be formed by interconnects (e.g., 1602, 1612, 1622, 1632).

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 17:
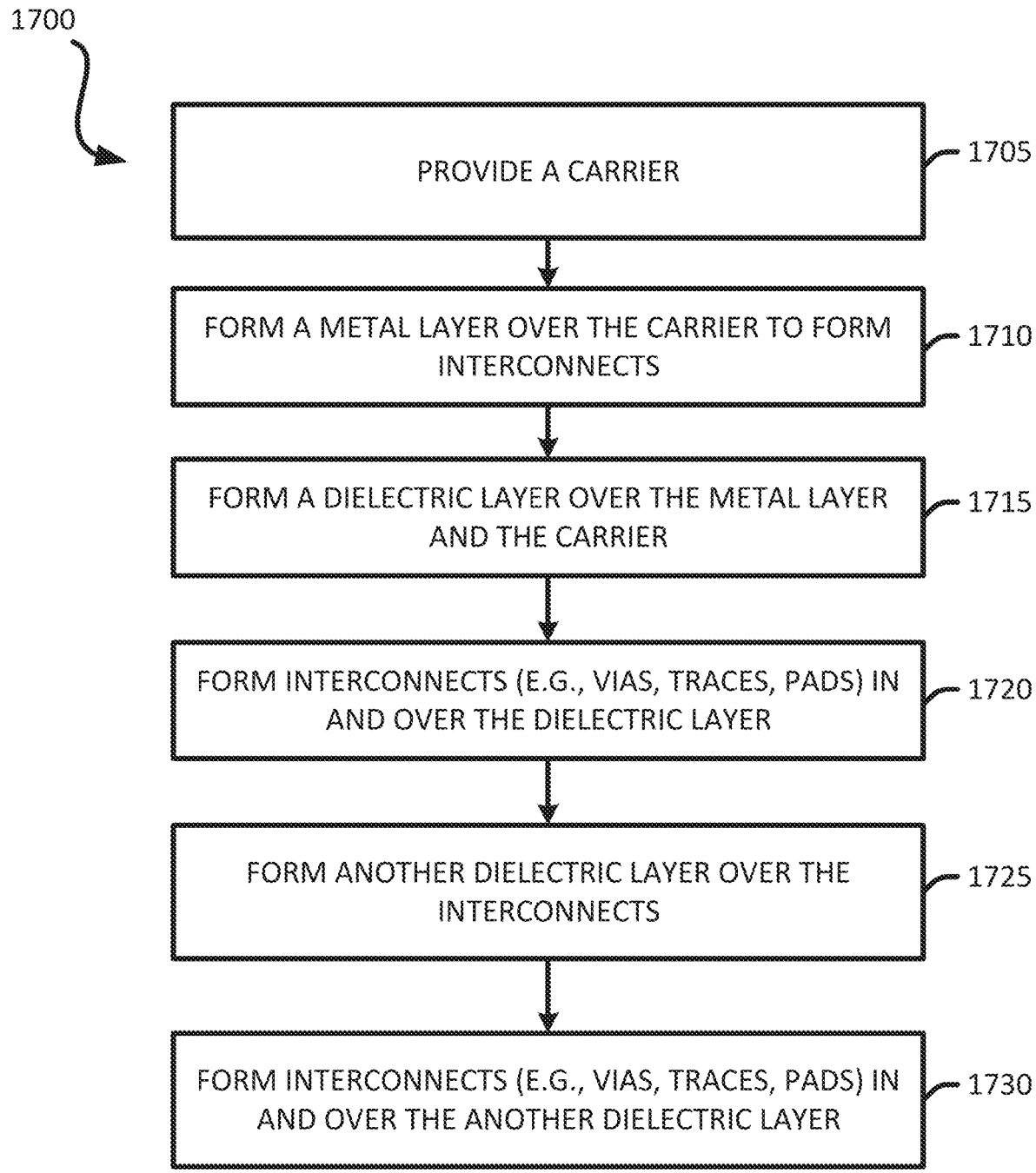
FIG. 17 illustrates an exemplary flow diagram of a method for fabricating a substrate a substrate that includes an inductive coupler for leakage signal reduction.

Exemplary Flow Diagram of a Method for Fabricating a Substrate Comprising an Inductive Coupler In some implementations, fabricating a substrate includes several processes. FIG. 17 illustrates an exemplary flow diagram of a method 1700 for providing or fabricating a substrate having an inductive coupler. In some implementations, the method 1700 of FIG. 17 may be used to provide or fabricate the substrate of FIG. 14. For example, the method of FIG. 17 may be used to fabricate the substrate 1400.

It should be noted that the sequence of FIG. 17 may combine one or more processes in order to simplify and/or clarify the method for providing or fabricating a substrate with an inductive coupler. In some implementations, the order of the processes may be changed or modified.

The method provides (at 1705) a carrier 1600. The method forms (at 1710) a metal layer over the carrier 1600. The metal layer may be patterned to form interconnects. A plating process may be used to form the metal layer and interconnects.

The method forms (at 1715) a dielectric layer 1420 over the carrier 1600 and the interconnects. The dielectric layer 1420 may include polyimide. Forming the dielectric layer may also include forming a plurality of cavities (e.g., 1610) in the dielectric layer 1420. The plurality of cavities may be formed using an etching process (e.g., photo etching) or laser process.

The method forms (at 1720) interconnects in and over the dielectric layer. For example, the interconnects 1612 may formed. A plating process may be used to form the interconnects. Forming interconnects may include providing a patterned metal layer over and/or in the dielectric layer.

The method forms (at 1725) a dielectric layer 1422 over the dielectric layer 1420 and the interconnects. The dielectric layer 1422 may include polyimide. Forming the dielectric layer may also include forming a plurality of cavities (e.g., 1620) in the dielectric layer 1422. The plurality of cavities may be formed using an etching process or laser process.

The method forms (at 1730) interconnects in and/or over the dielectric layer. For example, the interconnects 1622 may formed. A plating process may be used to form the interconnects. Forming interconnects may include providing a patterned metal layer over an in the dielectric layer.

The method may form additional dielectric layer(s) and additional interconnects as described at 1725 and 1730. At least some of the interconnects that are formed in the substrate may define the inductive coupler 1410, the inductor 1402, the inductor 1404, the ground terminal 1406, and the antenna terminal 1408.

Once all the dielectric layer(s) and additional interconnects are formed, the method may decouple (e.g., remove, grind out) the carrier (e.g., 1600) from the dielectric layer 1420, leaving the substrate with an inductive coupler. In some implementation, the coreless substrate is an embedded trace substrate (ETS).

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Electronic Devices

Figure 18:
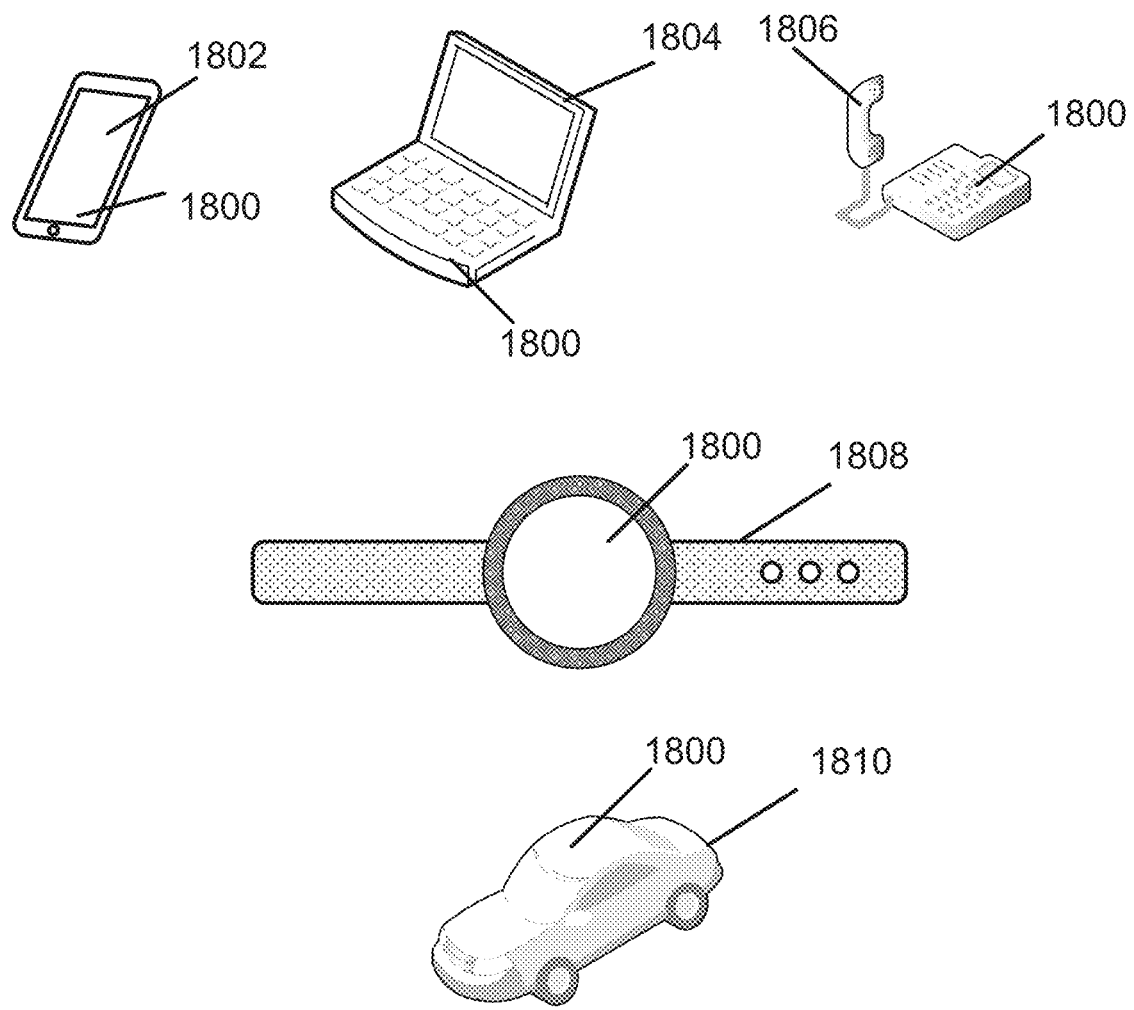
FIG. 18 illustrates various electronic devices that may integrate a die, an integrated device, a device package, a package, an integrated circuit, a substrate and/or a PCB described herein.

FIG. 18 illustrates various electronic devices that may be integrated with any of the aforementioned device, integrated device, integrated circuit (IC) package, integrated circuit (IC) device, semiconductor device, integrated circuit, die, interposer, package or package-on-package (PoP). For example, a mobile phone device 1802, a laptop computer device 1804, a fixed location terminal device 1806, a wearable device 1808, or automotive vehicle 1810 may include a device 1800 as described herein. The device 1800 may be, for example, any of the devices and/or integrated circuit (IC) packages described herein. The devices 1802, 1804, 1806 and 1808 and the vehicle 1810 illustrated in FIG. 18 are merely exemplary. Other electronic devices may also feature the device 1800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-15, 16A-16C, and/or 17-18 may be rearranged and/or combined into a single component, process, feature or function or embodied in several components, processes, or functions. Additional elements, components, processes, and/or functions may also be added without departing from the disclosure. It should also be noted FIGS. 1-15, 16A-16C, and/or 17-18 and its corresponding description in the present disclosure is not limited to dies and/or ICs. In some implementations, FIGS. 1-15, 16A-16C, and/or 17-18 and its corresponding description may be used to manufacture, create, provide, and/or produce devices and/or integrated devices. In some implementations, a device may include a die, a substrate, an integrated device, an integrated passive device (IPD), a die package, an integrated circuit (IC) device, a device package, an integrated circuit (IC) package, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is noted that the term "electrically coupled" means two or more components that can be electrically connected to one another when there is a current or signal present. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately", as used in the disclosure means within 10 percent of the 'value X'. For example, a value of about 1 or approximately 1, would mean a value in a range of 0.9-1.1.

In some implementations, an interconnect is an element or component of a device that allows or facilitates an electrical connection between two points, elements and/or components. In some implementations, an interconnect may include a trace, a via, a pad, a pillar, a metal layer (e.g., a redistribution metal layer), and/or an under bump metallization (UBM) layer. In some implementations, an interconnect is an electrically conductive material that may be configured to provide an electrical path for a signal (e.g., a data signal, ground or power). An interconnect may be part of a circuit. An interconnect may include more than one element or component. An interconnect may include one or more interconnects.

In some implementations, the height of the device and/or package may be defined along the Z-direction of the package, which is shown in the figures of the present disclosure. In some implementations, the Z-direction of the device and/or package may be defined along an axis between a top portion and a bottom portion of the device and/or package. The terms top and bottom may be arbitrarily assigned, however as an example, the top portion of the device and/or package may be a portion comprising an encapsulation layer, while a bottom portion of the package may be a portion comprising a redistribution portion or a plurality of solder balls. In some implementations, the top portion of the package may be a back side of the package, and the bottom portion of the package may be a front side of the package. The front side of the package may be an active side of the package. A top portion may be a higher portion relative to a lower portion. A bottom portion may be a lower portion relative to a higher portion.

The X-Y directions or the X-Y plane of the device and/or package may refer to the lateral direction and/or footprint of the device and/or package. Examples of X-Y directions are shown in the figures of the present disclosure. The width, length and/or diameter of an object may refer to dimension(s) along the X-Y dimensions and/or the X-Y plane. In many of the figures of the present disclosure, the devices and/or packages and their respective components are shown across a X-Z cross-section or X-Z plane. However, in some implementations, the packages and their representative components may be represented across a Y-Z cross-section or Y-Z plane.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A substrate comprising:
   at least one dielectric layer;
   a plurality of interconnects comprising a first plurality of interconnects and a second plurality of interconnects; and
   an inductive coupler formed in the at least one dielectric layer, the inductive coupler comprising:
      a first inductor formed in the at least one dielectric layer,
         wherein the first inductor is defined by at least the first plurality of interconnects,
         wherein the first plurality of interconnects of the first inductor are configured to be electrically coupled to (i) a first terminal of a transmitter filter and (ii) an antenna; and
      a second inductor formed in the at least one dielectric layer,
         wherein the second inductor is defined by at least the second plurality of interconnects,
         wherein the second plurality of interconnects of the second inductor are configured to be electrically coupled to (i) a second terminal of the transmitter filter and (ii) ground,
         wherein the second plurality of interconnects of the second inductor are configured to provide a path to ground for a rejected signal having a rejected frequency, and wherein the second inductor is located adjacent to the first inductor such that the rejected signal traveling through the second plurality of interconnects of the second inductor causes the first inductor to generate an induced signal that counteracts a leakage signal traveling through the transmitter filter.

2. The substrate of claim 1, wherein the induced signal is configured to travel towards the transmitter filter and the leakage signal is configured to travel away from the transmitter filter.

3. The substrate of claim 1, wherein the leakage signal has a first phase and the induced signal has a phase that is approximately reverse to the first phase.

4. The substrate of claim 1, wherein the leakage signal has the rejected frequency.

5. The substrate of claim 4, wherein the induced signal has the rejected frequency.

6. The substrate of claim 1, wherein the leakage signal is configured to travel towards a receiving filter.

7. The substrate of claim 6, wherein the leakage signal is configured to travel through an impedance matching component when traveling towards the receiving filter.

8. The substrate of claim 1,
wherein the first inductor is configured to be electrically coupled to the transmitter filter through a first plurality of interconnects, and
wherein the first inductor is configured to be electrically coupled to the antenna through a second plurality of interconnects.

9. The substrate of claim 1,
wherein the second inductor is configured to be electrically coupled to the transmitter filter through a third plurality of interconnects, and
wherein the second inductor is configured to be electrically coupled to ground through a fourth plurality of interconnects.

10. The substrate of claim 1, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. The substrate of claim 1, wherein the rejected signal is a signal configured to travel through and/or from the transmission filter.

12. The substrate of claim 1, wherein the leakage signal is a signal configured to travel through and/or from the transmission filter.

13. The substrate of claim 1,
wherein the rejected signal is a signal configured to travel through and/or from the transmission filter, and
wherein the leakage signal is a particular signal from the rejected signal that has leaked from the transmission filter and is configured to travel towards the first inductor.

14. The substrate of claim 1, wherein the induced signal travels in an opposite direction to the leakage signal.

15. The substrate of claim 1,
wherein the leakage signal is different from the rejected signal, and
wherein the rejected signal is a particular signal that the transmitter filter has determined should not pass through to the antenna.

* * * * *